(12) United States Patent
Adams et al.

(10) Patent No.: US 7,015,600 B2
(45) Date of Patent: Mar. 21, 2006

(54) PULSE GENERATOR CIRCUIT AND SEMICONDUCTOR DEVICE INCLUDING SAME

(75) Inventors: Chad Allen Adams, Byron, MN (US); Todd Alan Christensen, Rochester, MN (US); Peter Thomas Freiburger, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 520 days.

(21) Appl. No.: 10/268,287

(22) Filed: Oct. 10, 2002

(65) Prior Publication Data

US 2004/0070433 A1    Apr. 15, 2004

(51) Int. Cl.
*H03K 3/00* (2006.01)
*H03K 3/64* (2006.01)
*G06F 1/12* (2006.01)

(52) U.S. Cl. .................. 307/106; 307/409; 307/411; 713/401

(58) Field of Classification Search ............... 307/106, 307/409, 411
See application file for complete search history.

(56) References Cited

U.S. PATENT DOCUMENTS 6,252,441 B1 *   6/2001   Lee et al. ................... 327/141

6,707,331 B1 *   3/2004   Nguyen ...................... 327/166

FOREIGN PATENT DOCUMENTS

GB         2220284 A   *   1/1990

* cited by examiner

*Primary Examiner*—Brian Sircus
*Assistant Examiner*—Hal I. Kaplan
(74) *Attorney, Agent, or Firm*—Carr LLP; Diana R. Gerhardt

(57) ABSTRACT

A pulse generator circuit is disclosed including a delay element coupled to a logic circuit. The delay element receives a clock signal CLK and a signal X and produces a signal XN dependent upon the clock signal CLK and the signal X. The logic circuit receives the clock signal CLK and the signal XN and produces a signal ACLK such that ACLK=CLK·XN'. The signal ACLK may include a series of positive pulses. The delay element may be, for example, one of multiple delay elements coupled in series, and signal X may be an output of a preceding one of the delay elements. A semiconductor device is described including the above pulse generator circuit and a self-resetting logic circuit. The self-resetting logic circuit receives the signal ACLK and one or more input signals and performs a logic operation using the one or more input signals during the positive pulses. The semiconductor device may include, for example, a random access memory (RAM) device, and the self-resetting logic circuit may form a part of a decoder circuit of the RAM device.

16 Claims, 6 Drawing Sheets

PULSE GENERATOR CIRCUIT AND SEMICONDUCTOR DEVICE INCLUDING SAME

TECHNICAL FIELD

This invention relates generally to electronic circuits and, more particularly, to pulse generator circuits used in semiconductor logic circuits.

BACKGROUND OF THE INVENTION

Dynamic logic circuits are based on electrical charge storage and transfer. One or more nodes are used to store electrical charge. The nodes are typically charged to one voltage level (i.e., precharged) during a precharge operation, and selectively charged (e.g., discharged) to another voltage level during a subsequent evaluation operation dependent upon input signals. For example, nodes of dynamic logic circuits are commonly precharged to a high voltage level when a synchronizing clock signal is at one voltage level, and selectively discharged to a low voltage level dependent upon the input signals when the clock signal transitions to another voltage level.

Self-resetting logic circuitry is a type of dynamic logic circuitry in which pulses control logic operations. In self-resetting logic circuitry, one or more nodes are typically precharged between pulses, and logic operations are performed during the pulses. Widths of the pulses are typically selected such that correct results are produced by the self-resetting logic circuitry. In general, reducing the widths of the pulses typically improves performance.

A typical pulse generator used in self-resetting logic circuitry generates pulses from a single edge of a clock signal (e.g., a rising edge transition of the clock signal or a falling edge transition of the clock signal). The typical pulse generator produces pulses having a width that is a fixed maximum at relatively low frequencies of the clock signal, and generally decreases as the frequency of the clock signal increases.

FIG. 1 is a diagram of a known pulse generator circuit 100 for generating a pulse signal PCLK from a clock signal CLK. The pulse generator 100 generates pulses from rising edge transitions of the clock signal CLK, and includes an AND gate 102 and n inverters in series, three of which are shown in FIG. 1 and labeled 104A, 104B, and 104C (n is typically an odd integer greater than or equal to 3).

An "A" input of the AND gate 102 receives the clock signal CLK. The clock signal CLK propagates through the n inverters 104 in series and arrives at a "B" input of the AND gate 102. While propagating through the n inverters 104 in series, the clock signal CLK experiences a delay time equal to "$t_{DELAY}$" as indicated in FIG. 1. The AND gate 102 produces the PCLK signal by logically ANDing the signals at the A and B inputs (i.e., by logically ANDing the A and B input signals). As indicated in FIG. 1, the AND gate 102 has an internal propagation delay time equal to "$t_{AND}$."

FIG. 2 is a timing diagram showing various signals in the known pulse generator circuit 100 of FIG. 1 versus time. In FIG. 2, the clock signal CLK alternates between a low voltage level and a high voltage level, and remains at the high voltage level for an amount of time greater than the delay time $t_{DELAY}$ of the n inverters 104 of FIG. 1. In other words, the clock signal CLK has a "high" time of "$t_{HIGH}$" that is greater than the delay time $t_{DELAY}$ of the n inverters 104 of FIG. 1. The A input signal to the AND gate 102 is the clock signal CLK, and the B input signal is the clock signal CLK inverted and delayed in time by the delay time $t_{DELAY}$ of the n inverters 104. The output signal PCLK produced by the AND gate 102 is a series of positive pulses having pulse width times "$t_{PW}$" as indicated in FIG. 2. Each of the positive pulses is generated the delay time $t_{AND}$ after a rising edge of the clock signals CLK, and has a pulse width of $t_{DELAY}$.

FIG. 3 is a timing diagram showing various signals in the pulse generator circuit 100 of FIG. 1 versus time, wherein the high time $t_{HIGH}$ of the clock signal CLK is less than the delay time $t_{DELAY}$ of the n inverters 104 of FIG. 1. The pulse width times $t_{PW}$ of the PCLK signal in FIG. 3 (i.e., produced at a higher frequency of the clock signal CLK) are significantly less than the pulse width times $t_{PW}$ in FIG. 2 (i.e., produced at a lower frequency of the clock signal CLK).

In general, when the high time $t_{HIGH}$ of the clock signal CLK is greater than or equal to the delay time $t_{DELAY}$ (i.e., at relatively low frequencies of the clock signal CLK), the pulse generator circuit 100 of FIG. 1 produces signal PCLK with pulses having a width $t_{PW}$ that is a fixed maximum of the delay time $t_{DELAY}$. When the high time $t_{HIGH}$ of the clock signal CLK is less than $t_{DELAY}$ (i.e., at relatively high frequencies of the clock signal CLK), the pulses of the PCLK signal have widths $t_{PW}$ that are less than $t_{DELAY}$, and decrease with increasing frequency of the clock signal CLK.

A problem arises in the pulse generator circuit 100 of FIG. 1 in that the width of the pulses of the PCLK signal cannot be increased beyond the fixed maximum of $t_{DELAY}$. In a device including dynamic logic circuitry using the pulse generator 100, should the maximum width of the pulses of the PCLK signal be insufficient to produce correct operation of the dynamic logic circuitry, the faulty device typically cannot be repaired.

The pulses of the signal PCLK in FIG. 3 (i.e., produced at a higher frequency of the clock signal CLK) are also delayed in time with respect to the clock signal CLK to a greater degree than are the pulses of the signal PCLK in FIG. 2 (i.e., produced at a lower frequency of the clock signal CLK). In general, when the high time $t_{HIGH}$ of the clock signal CLK is greater than or equal to the delay time $t_{DELAY}$ (i.e., at relatively low frequencies of the clock signal CLK), the pulse generator circuit 100 of FIG. 1 produces signal PCLK with pulses delayed in time from leading edges of the clock signal CLK by delay time $t_{AND}$. As the high time $t_{HIGH}$ of the clock signal CLK is decreased below the delay time $t_{DELAY}$, the pulses of the PCLK signal are increasingly delayed in time relative to the clock signal CLK.

Another problem arises in the pulse generator circuit 100 of FIG. 1 in that at higher frequencies of the clock signal CLK, the variable time delay between the pulses of the PCLK signal and the clock signal CLK may negatively affect synchronization between dynamic logic circuitry using the typical pulse generator and other logic circuitry controlled by the clock signal CLK.

SUMMARY OF THE INVENTION

A pulse generator circuit is disclosed including a delay element coupled to a logic circuit. The delay element receives a clock signal CLK and a signal X, and produces a signal XN dependent upon the clock signal CLK and the signal X. The logic circuit receives the clock signal CLK and the signal XN, and produces a signal ACLK such that ACLK=CLK·XN'. The signal ACLK may include a series of positive pulses. The delay element may be, for example, one of multiple delay elements coupled in series, and signal X may be an output of a preceding one of the delay elements.

A semiconductor device is described including the above pulse generator circuit and a self-resetting logic circuit. The self-resetting logic circuit receives the signal ACLK and one or more input signals, and performs a logic operation using the one or more input signals during the positive pulses. The semiconductor device may include, for example, a random access memory (RAM) device, and the self-resetting logic circuit may form a part of a decoder circuit of the RAM device.

BRIEF DESCRIPTION OF THE DRAWINGS

The invention may be understood by reference to the following description taken in conjunction with the accompanying drawings, in which like reference numerals identify similar elements, and in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electro-magnetic signaling techniques, and the like, have been omitted inasmuch as such details are not considered necessary to obtain a complete understanding of the present invention, and are considered to be within the understanding of persons of ordinary skill in the relevant art.

It is further noted that, unless indicated otherwise, all functions described herein may be performed in either hardware or software, or some combination thereof. In a preferred embodiment, however, the functions are performed by a processor, such as a computer or an electronic data processor, in accordance with code, such as computer program code, software, and/or integrated circuits that are coded to perform such functions, unless indicated otherwise.

Figure 1:
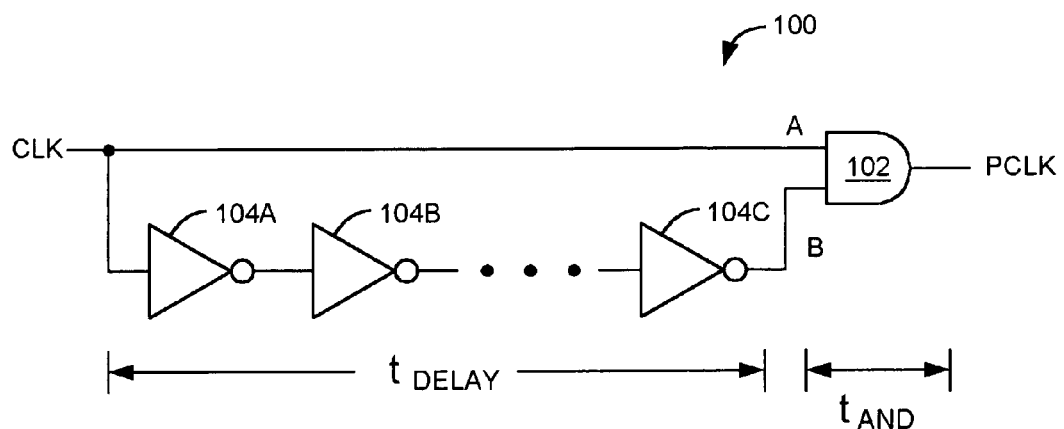
FIG. 1 is a diagram of a known pulse generator circuit for generating a pulse signal from a clock signal, wherein the known pulse generator circuit includes an odd number of inverters coupled in series.
Figure 2:
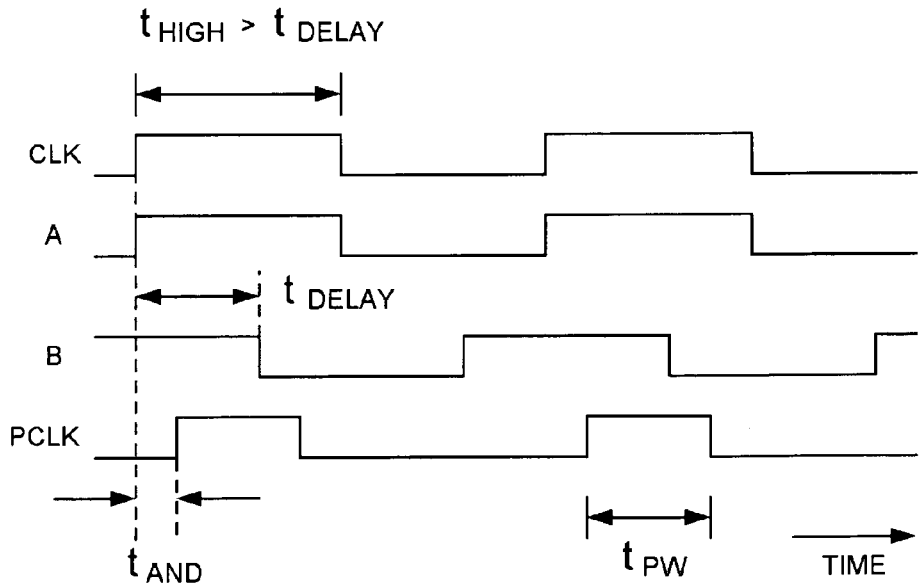
FIG. 2 is a timing diagram showing various signals in the known pulse generator circuit of FIG. 1 versus time, wherein the clock signal alternates between a low voltage level and a high voltage level, and remains at the high voltage level for an amount of time greater than a cumulative delay time of the inverters.
Figure 3:
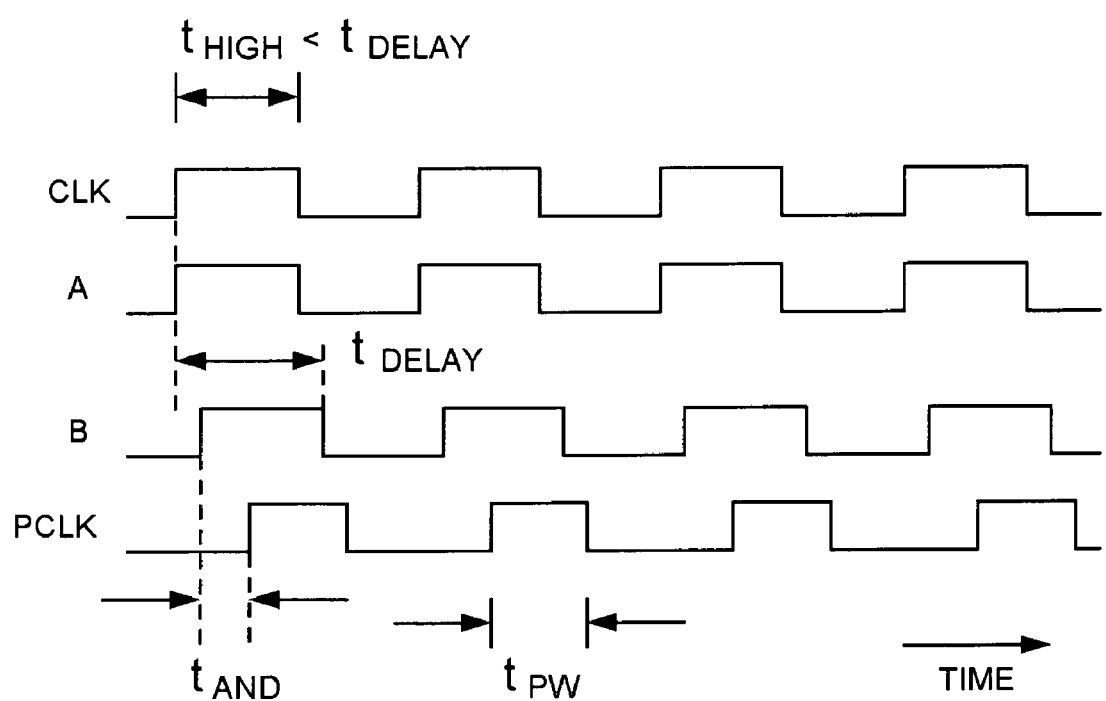
FIG. 3 is a timing diagram showing various signals in the pulse generator circuit of FIG. 1 versus time, wherein the clock signal remains at the high voltage level for an amount of time less than the cumulative delay time of the inverters.
Figure 4:
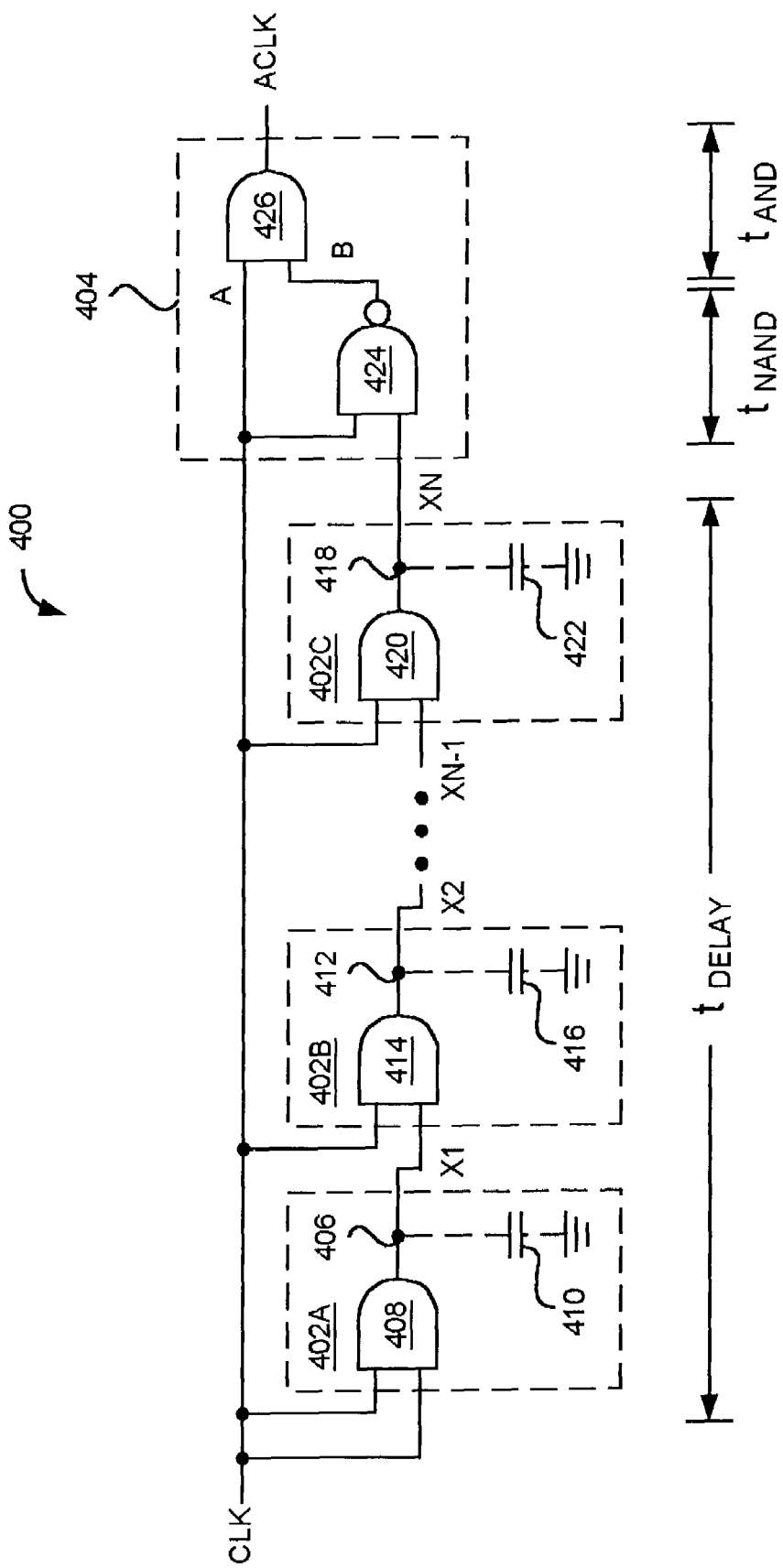
FIG. 4 is a diagram of one embodiment of a pulse generator circuit for generating a pulse signal from a clock signal, wherein the pulse generator circuit includes n delay elements ($n \geq 1$) and a NAND gate.

FIG. 4 is a diagram of one embodiment of a pulse generator circuit 400 for generating a pulse signal ACLK from a clock signal CLK. The pulse generator circuit 400 includes n delay elements coupled in series, three of which are shown in FIG. 4 and labeled 402A, 402B, and 402C, and a logic circuit 404. In general, n is an integer greater than or equal to 1.

The delay element 402A is a first delay element in the series of delay elements. In general, the delay element 402A receives the clock signal CLK at two separate input terminals, and produces an output signal 'X1' at an output terminal dependent upon the clock signal CLK. The delay element 402A includes a node 406 coupled to the output terminal, and produces the output signal X1 at the node 406. In the embodiment of FIG. 4, the delay element 402A includes a 2-input AND gate 408. Both inputs of the AND gate 408 receive the CLK signal, and an output of the AND gate 408 drives the node 406.

As indicated in FIG. 4, an optional capacitance 410 may be added (e.g., connected) between the node 406 and a circuit ground. For example, a capacitor may be coupled between the node 406 and the circuit ground, or a capacitance between the node 406 and the circuit ground may be increased in some other way. Without the optional capacitance 410, the output signal X1 is expectedly the CLK signal delayed by the delay time $t_{AND}$ of the AND gate 408. With the optional capacitance 410, the output signal X1 is expectedly a version of the CLK signal delayed by an amount of time greater than the delay time $t_{AND}$, and with distorted transitions (i.e., "edges") due to the charging and discharging of the optional capacitance 410.

The delay element 402B follows the delay element 402A in the series of delay elements. In general, the delay element 402B receives the clock signal CLK at a first input terminal, the signal X1 produced by the preceding delay element 402A at a second input terminal, and produces an output signal 'X2' at an output terminal dependent upon the clock signal CLK and the signal X1. The delay element 402B includes a node 412 coupled to the output terminal, and produces the output signal X2 at the node 412.

In the embodiment of FIG. 4, the delay element 402B includes a 2-input AND gate 414. One input of the AND gate 414 receives the CLK signal, and the other input terminal receives the X1 signal. An output of the AND gate 414 drives the node 412.

As indicated in FIG. 4, an optional capacitance 416 may be added (e.g., connected) between the node 412 and the circuit ground. For example, a capacitor may be coupled between the node 412 and the circuit ground, or a capacitance between the node 412 and the circuit ground may be increased in some other way. Without the optional capacitance 412, and when the clock signal CLK is a logic '1' level (i.e., a high voltage level), the output signal X2 is expectedly the X1 signal delayed by the delay time $t_{AND}$ of the AND gate 414. When the output signal X2 is the logic '1' level and either the clock signal CLK or the X1 signal transitions to a logic '0' level (i.e., a low voltage level), the output signal X2 transitions to the logic '0' level after the delay time $t_{AND}$ of the AND gate 414.

With the optional capacitance 416, the output signal X2 is expectedly a version of the above described output signal X2 without the optional capacitance 416 delayed by an amount of time greater than the delay time $t_{AND}$ and with distorted edges due to the charging and discharging of the optional capacitance 416.

The delay element 402C is the last delay element in the series of delay elements. In general, the delay element 402C receives the clock signal CLK at a first input terminal, a signal 'XN−1' produced by a preceding delay element at a second input terminal, and produces an output signal 'XN' at an output terminal dependent upon the clock signal CLK and the signal XN−1. The delay element 402C includes a node 418 coupled to the output terminal and produces the output signal XN at the node 418.

In the embodiment of FIG. 4, the delay element 402C includes a 2-input AND gate 420. One input of the AND gate 420 receives the CLK signal, and the other input terminal receives the XN−1 signal. An output of the AND gate 420 drives the node 418.

As indicated in FIG. 4, an optional capacitance 422 may be added (e.g., connected) between the node 418 and the circuit ground. For example, a capacitor may be coupled between the node 418 and the circuit ground, or a capacitance between the node 418 and the circuit ground may be increased in some other way. Without the optional capacitance 422, and when the clock signal CLK is the logic '1' level, the output signal XN is expectedly the XN−1 signal delayed by the delay time $t_{AND}$ of the AND gate 420. When the output signal XN is the logic '1' level and either the clock signal CLK or the XN−1 signal transitions to the logic '0' level, the output signal XN transitions to the logic '0' level after the delay time $t_{AND}$ of the AND gate 420.

With the optional capacitance 422, the output signal XN is expectedly a version of the above described output signal XN without the optional capacitance 422 delayed by an amount of time greater than the delay time $t_{AND}$ and with distorted edges due to the charging and discharging of the optional capacitance 422.

The logic circuit 404 includes a 2-input NAND gate 424 and a 2-input AND gate 426. In general, the logic circuit 404 receives the clock signal CLK and the signal XN produced by the last delay element 402C and produces an output signal ACLK such that the output signal ACLK is the logical AND of the clock signal CLK and the logical inverse of the signal XN (i.e., ACLK=CLK·XN'). As described below, the output signal ACLK includes a series of positive pulses.

One input of the NAND gate 424 receives the CLK signal, and the other input receives the signal XN produced by the last delay element 402C. While propagating through the n delay elements 402 in series, the clock signal CLK experiences a time delay equal to "$t_{DELAY}$," as indicated in FIG. 4, and exits the last delay element 402C as the signal XN. As described above, the edges of the signal XN may be distorted (e.g., due to the optional capacitances 410, 416, and/or 422). The NAND gate 424 produces an output by logically NANDing the signal XN produced by the last delay element 402C and the clock signal CLK, and provides the output to a "B" input of the AND gate 426. As indicated in FIG. 4, the NAND gate 424 has an internal delay equal to "$t_{NAND}$."

The AND gate 426 produces the output signal ACLK by logically ANDing the clock signal CLK at an "A" input and the output of the NAND gate 424 at the B input (i.e., by logically ANDing the A and B input signals). As indicated in FIG. 4, the AND gate 426 has an internal delay equal to $t_{AND}$.

Figure 5:
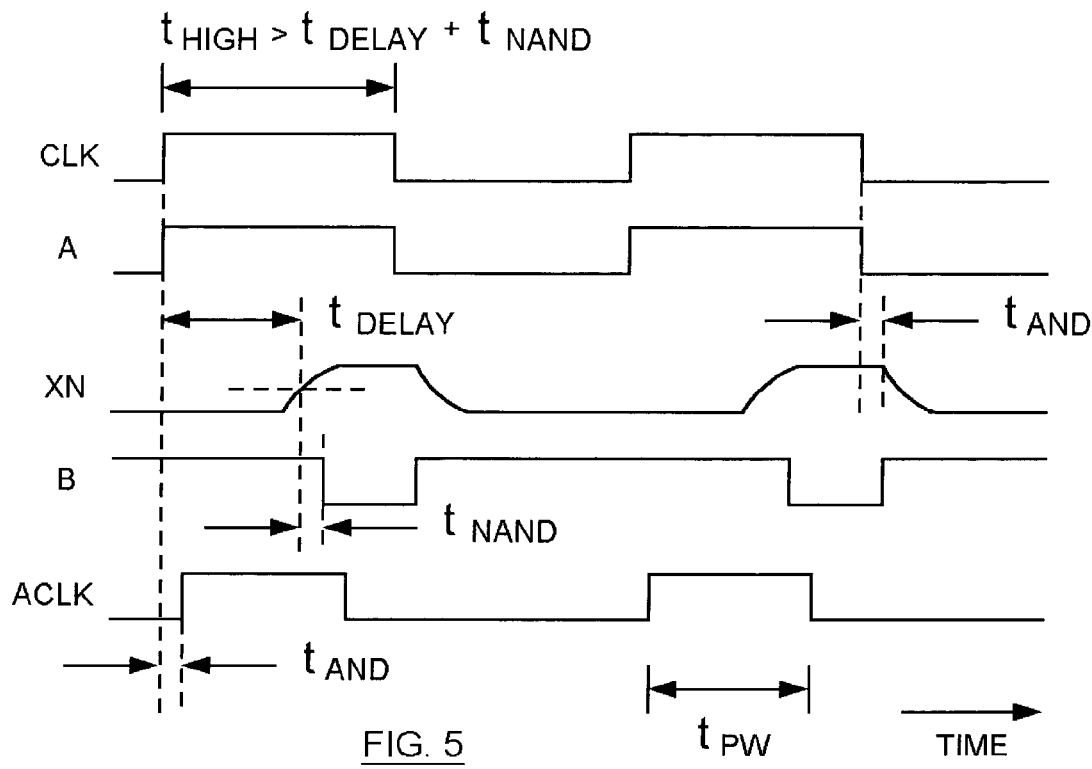
FIG. 5 is a timing diagram showing various signals in the pulse generator circuit of FIG. 4 versus time, wherein the clock signal alternates between a low logic level and a high logic level, and remains at the high voltage level for an amount of time greater than a sum of a cumulative delay time of the n delay elements and a delay time of the NAND gate.

FIG. 5 is a timing diagram showing various signals in the pulse generator circuit 400 of FIG. 4 versus time. In FIG. 5, the clock signal CLK alternates between a low logic level and a high logic level and remains at the high voltage level for an amount of time greater than a sum of the delay time $t_{DELAY}$ of the n delay elements 402 of FIG. 4 and the delay time $t_{NAND}$ of the NAND gate 424 of FIG. 4. In other words, the clock signal CLK has a "high" time of "$t_{HIGH}$" that is greater than a sum of the delay time $t_{DELAY}$ of the n delay elements 402 of FIG. 4 and the delay time $t_{NAND}$ of the NAND gate 424 of FIG. 4. The A input signal to the AND gate 426 of FIG. 4 is the clock signal CLK. The signal XN produced by the delay element 402C of FIG. 4 results from propagating the clock signal CLK through the n delay elements 402. In the embodiment of FIG. 5, the edges of the signal XN are distorted (e.g., due to the optional capacitances 410, 416 and/or 422 of FIG. 4).

The B input signal to the AND gate 426 results from logically NANDing the clock signal CLK and the signal XN and is delayed in time by delay time $t_{NAND}$. The output signal ACLK produced by the AND gate 402 is a series of positive pulses each having pulse width times "$t_{PW}$" as indicated in FIG. 5. Each of the positive pulses is generated delay time $t_{AND}$ after a rising edge of the clock signal CLK and has a pulse width equal to ($t_{DELAY}+t_{NAND}$).

Figure 6:
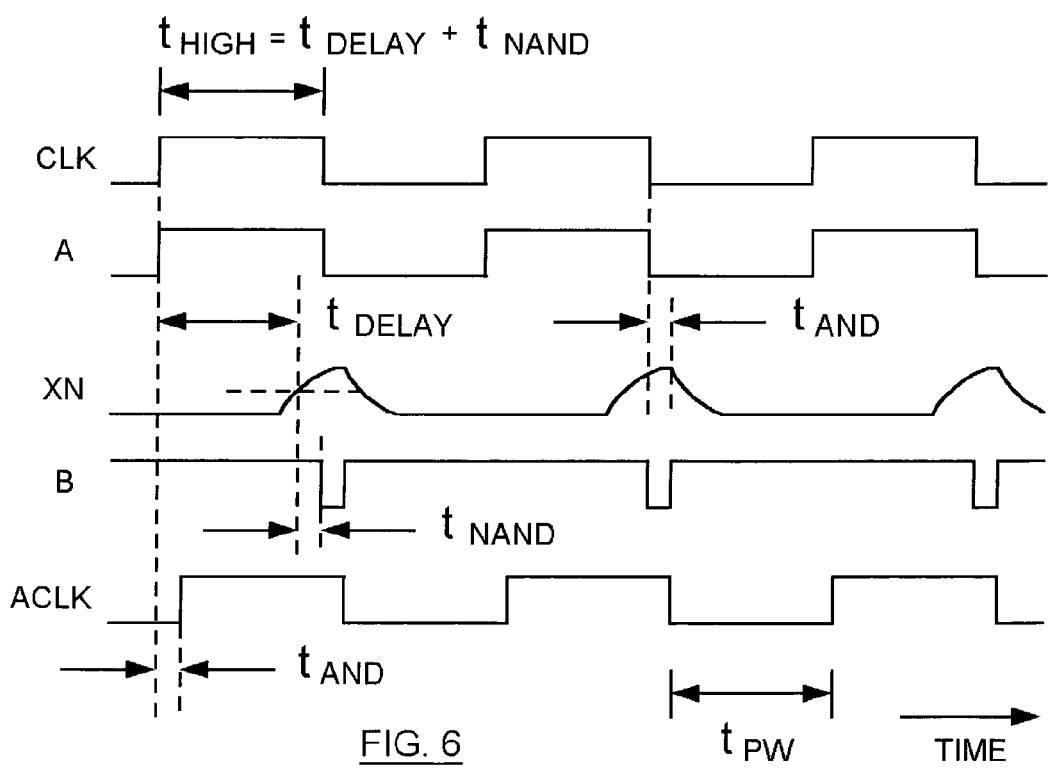
FIG. 6 is a timing diagram showing various signals in the pulse generator circuit of FIG. 4 versus time, wherein the clock signal remains at the high voltage level for an amount of time equal to the sum of the cumulative delay time of the n delay elements and the delay time of the NAND gate.

FIG. 6 is a timing diagram showing various signals in the pulse generator circuit 400 of FIG. 4 versus time, wherein the high time $t_{HIGH}$ of the clock signal CLK is equal to the sum of the delay time $t_{DELAY}$ of the n delay elements 402 of FIG. 4 and the delay time $t_{NAND}$ of the NAND gate 424 of FIG. 4. As in FIG. 5, the A input signal to the AND gate 426 of FIG. 4 is the clock signal CLK, and the signal XN results from propagating the clock signal CLK through the n delay elements 402. The edges of the signal XN are distorted (e.g., due to the optional capacitances 410, 416 and/or 422 of FIG. 4) as in FIG. 5.

The B input signal to the AND gate 426 of FIG. 4 results from logically NANDing the clock signal CLK and the signal XN and is delayed in time by delay time $t_{NAND}$. As in FIG. 5, the output signal ACLK produced by the AND gate 426 of FIG. 4 is a series of positive pulses each generated the delay time $t_{AND}$ after a rising edge of the clock signal CLK and having pulse width times $t_{PW}$ equal to ($t_{DELAY}+t_{NAND}$).

Figure 7:
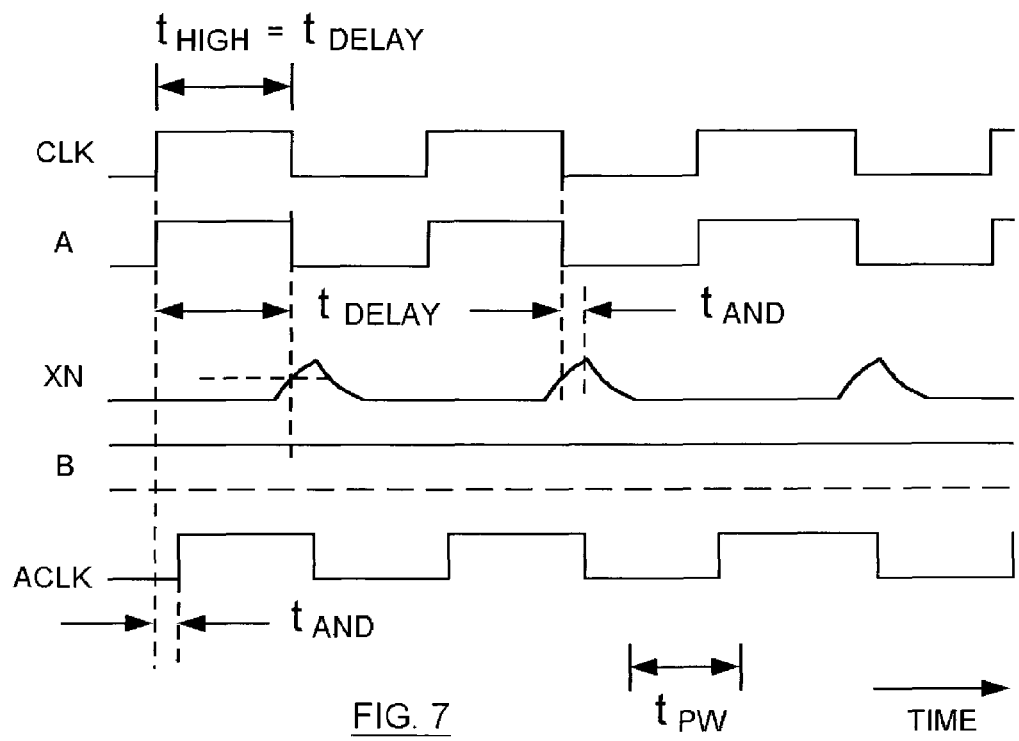
FIG. 7 is a timing diagram showing various signals in the pulse generator circuit of FIG. 4 versus time, wherein the clock signal remains at the high voltage level for an amount of time equal to the cumulative delay time of the n delay elements.

FIG. 7 is a timing diagram showing various signals in the pulse generator circuit 400 of FIG. 4 versus time, wherein the high time $t_{HIGH}$ of the clock signal CLK is equal to the delay time $t_{DELAY}$ of the n delay elements 402 of FIG. 4. As in FIGS. 5 and 6, the A input signal to the AND gate 426 of FIG. 4 is the clock signal CLK, and the signal XN results from propagating the clock signal CLK through the n delay elements 402. The edges of the signal XN are distorted (e.g., due to the optional capacitances 410, 416 and/or 422 of FIG. 4) as in FIGS. 5–6.

As the signal XN is never in a logic '1' voltage range when the clock signal CLK is a logic '1', the B input signal to the AND gate 426 of FIG. 4 is a constant high voltage level. In FIG. 7, the output signal ACLK produced by the AND gate 426 is the clock signal CLK delayed in time by $t_{AND}$ and may be considered a series of positive pulses each generated the delay time $t_{AND}$ after a rising edge of the clock signal CLK and having pulse width times $t_{PW}$ equal to $t_{HIGH}$.

Figure 8:
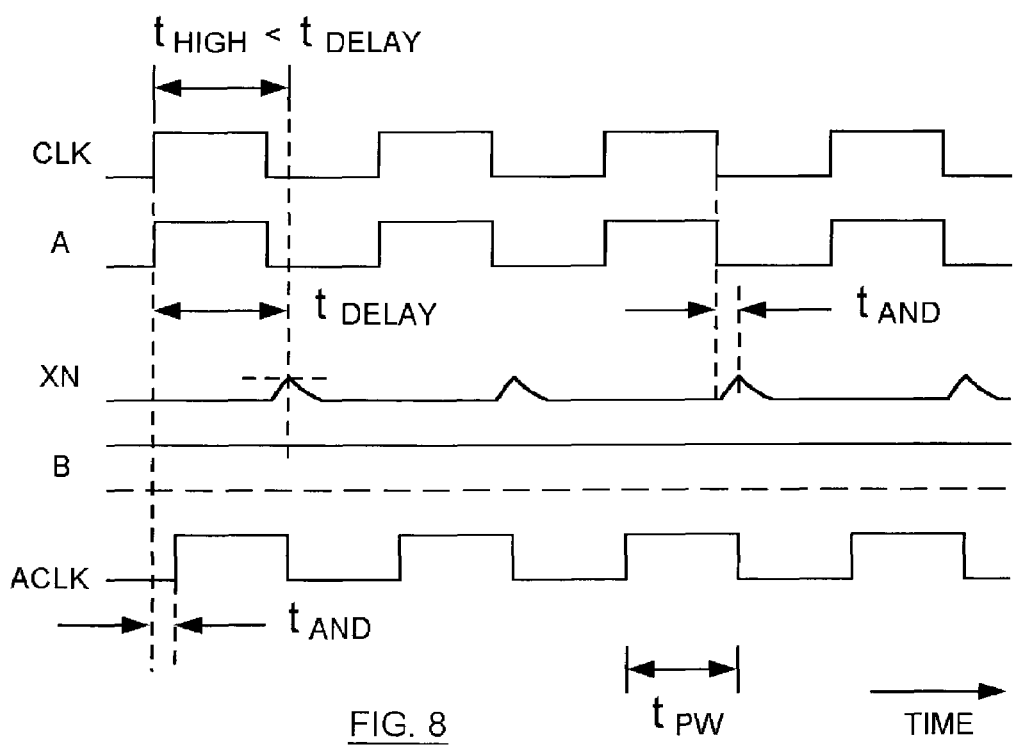
FIG. 8 is a timing diagram showing various signals in the pulse generator circuit of FIG. 4 versus time, wherein the clock signal remains at the high voltage level for an amount of time less than the cumulative delay time of the n delay elements.

FIG. 8 is a timing diagram showing various signals in the pulse generator circuit 400 of FIG. 4 versus time, wherein the high time $t_{HIGH}$ of the clock signal CLK is less than the delay time $t_{DELAY}$ of the n delay elements 402 of FIG. 4. As in FIGS. 5–7, the A input signal to the AND gate 426 of FIG. 4 is the clock signal CLK, and the signal XN results from propagating the clock signal CLK through the n delay elements 402. The edges of the signal XN are distorted (e.g., due to the optional capacitances 410, 416 and/or 422 of FIG. 4) as in FIGS. 5–7.

As the signal XN is never in a logic '1' voltage range, the B input signal to the AND gate 426 of FIG. 4 is a constant high voltage level. As in FIG. 7, the output signal ACLK produced by the AND gate 426 is the clock signal CLK delayed in time by $t_{AND}$ and may be considered a series of positive pulses each generated the delay time $t_{AND}$ after a rising edge of the clock signal CLK and having pulse width times $t_{PW}$ equal to $t_{HIGH}$.

The pulse generator circuit 400 of FIG. 4 produces positive pulses having a width that is a fixed maximum of $(t_{DELAY}+t_{NAND})$ at relatively low frequencies of the clock signal, and a fixed minimum of a high time $t_{HIGH}$ of the clock signal CLK at relatively high frequencies of the clock signal. In a device including the pulse generator circuit 400, the width of the pulses can be increased from the fixed minimum of $t_{HIGH}$ to the fixed maximum of $(t_{DELAY}+t_{NAND})$ simply by reducing the frequency of the clock signal CLK. Thus where pulse widths are not sufficient to produce correct results within the device at relatively high frequencies of the clock signal CLK, it may be possible to make the device operational simply by reducing the frequency of the clock signal CLK. Further, the wider pulse widths achieved by reducing the frequency of the clock signal CLK may be beneficial during debugging and/or logic verification of the device.

At higher frequencies of the clock signal CLK where the high time $t_{HIGH}$ of the clock signal CLK is less than $(t_{DELAY}+t_{NAND})$, the widths of positive pulses produced by the pulse generator circuit 400 of FIG. 4 are equal to the high time $t_{HIGH}$ of the clock signal CLK. At lower frequencies of the clock signal CLK where the high time $t_{HIGH}$ is greater than or equal to $(t_{DELAY}+t_{NAND})$, the widths of positive pulses are equal to $(t_{DELAY}+t_{NAND})$. The time period $(t_{DELAY}+t_{NAND})$ may be selected to be just long enough to sufficiently counteract the effects of leakage currents in dynamic logic circuitry using the pulse generator 400 at the lower frequencies. In this situation, the dynamic logic circuitry would expectedly not require performance degrading keeper devices to ensure proper operation of the circuitry at the lower frequencies.

It is also noted that a fixed time delay of $t_{AND}$ exists between leading edges of the clock signal CLK and leading edges of the positive pulses produced by the pulse generator circuit 400 of FIG. 4 at all frequencies of the clock signal CLK. As a result, synchronization may be more easily maintained between dynamic logic circuitry using the pulse generator 400 of FIG. 4 and other logic circuitry controlled by the clock signal CLK.

Figure 9:
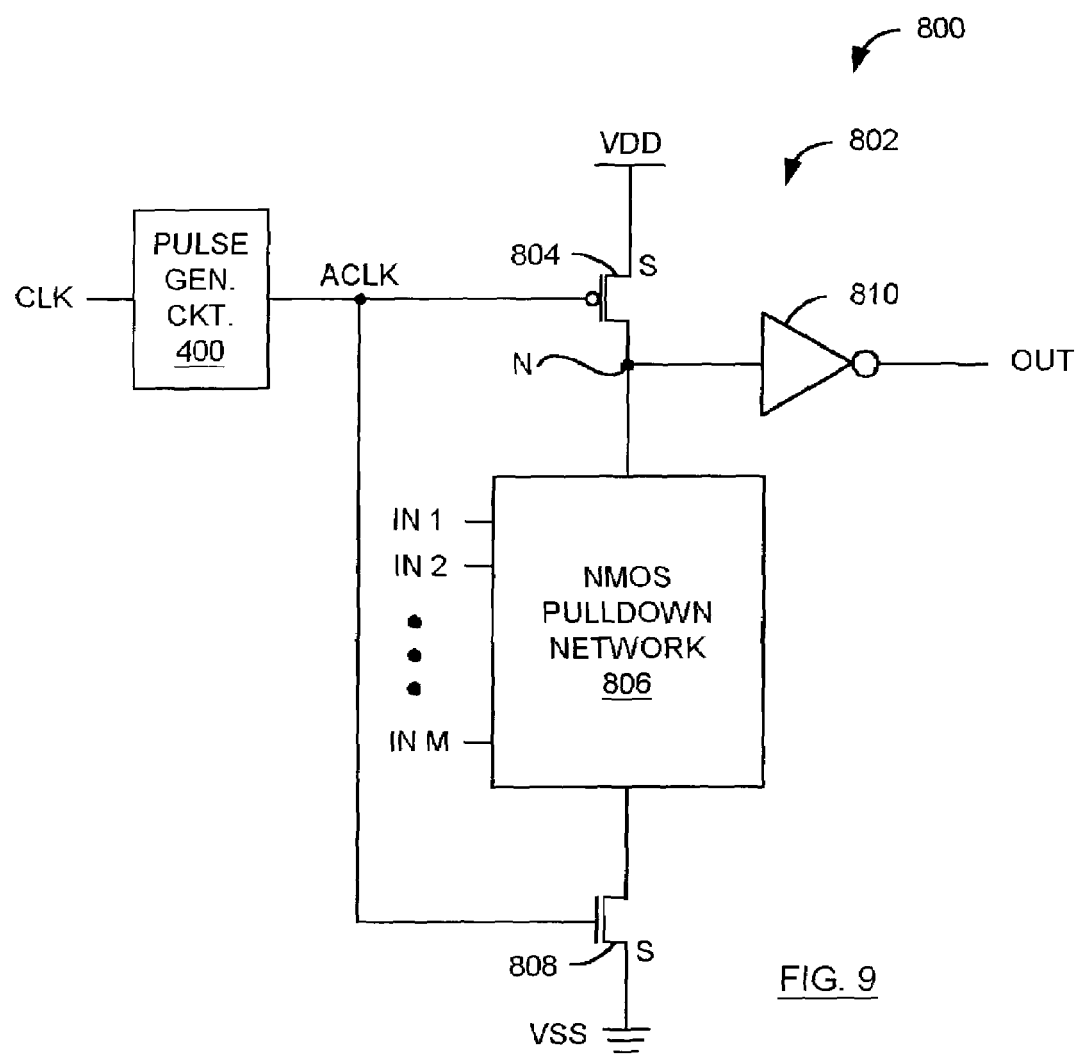
FIG. 9 is a diagram of a semiconductor device including the pulse generator circuit of FIG. 4 and a self-resetting logic circuit.

FIG. 9 is a diagram of a semiconductor device 800 including the pulse generator circuit 400 of FIG. 4 and a self-resetting logic circuit 802. The self-resetting logic circuit 802 is a dynamic logic circuit and uses the pulse signal ACLK produced by the pulse generator circuit 400 during both a precharge operation and an evaluation operation. During the evaluation operation, the self-resetting logic circuit 802 performs a logic function (e.g., NAND, NOR, AND-OR-INVERT, etc.). The semiconductor device 800 may be, for example, a random access memory (RAM) device (e.g., a static RAM device or a dynamic RAM device), and the self-resetting logic circuit 802 may, for example, form a part of a decoder circuit of the RAM device.

During the precharge operation, the ACLK signal is a low voltage level. A p-channel metal oxide semiconductor (PMOS) transistor 804 of the self-resetting logic circuit 802, coupled between a high power supply voltage level "$V_{DD}$" and a node "N," receives the ACLK signal at a gate terminal. During the precharge operation, the PMOS transistor 804 is biased into a conducting state and charges the node N to a high voltage level.

The self-resetting logic circuit 802 also includes an n-channel metal oxide semiconductor (NMOS) pulldown network 806 coupled between the node N and an NMOS transistor 808. In the embodiment of FIG. 9, the NMOS pulldown network 806 includes m NMOS transistors each receiving a different one of m input signals. In FIG. 9 the m input signals are labeled "IN 1," "IN 2," and "IN m." In general, m may be an integer greater than or equal to 1. When m=1, the self-resetting logic circuit 802 inverts the input signal twice and functions as a non-inverting buffer.

The self-resetting logic circuit 802 also includes the NMOS transistor 808 coupled in series between the NMOS pulldown network 806 and the low power supply voltage level $V_{SS}$. The NMOS transistor 808 receives the ACLK signal at a gate terminal. During the evaluation operation, the ACLK signal is a high voltage level, and the NMOS transistor 808 is biased into a conducting state. When a high resistance current path exists between the node N and the low power supply voltage level $V_{SS}$ through the NMOS pulldown network 806 and the NMOS transistor 808, the node N substantially remains at the high voltage level. On the other hand, when a low-resistance current path is created between the node N and the low power supply voltage level $V_{SS}$ through the NMOS pulldown network 806 and the NMOS transistor 808, the node N is discharged to a low voltage level.

An inverter 810 of the self-resetting logic circuit 802 inverts the voltage level at the node N to produce an output signal "OUT" at an output terminal. During a final portion of the evaluation operation, the output signal OUT is a logic function if the m inputs "IN 1" through "IN M."

It is noted that in the self-resetting logic circuit 802, the pulses of the ACLK signal must have a certain minimum pulse width for the self-resetting logic circuit 802 to perform the logic function correctly during the evaluation operation. As described above, the width of the pulses of the ACLK signal can be increased from the fixed minimum of $t_{HIGH}$ to the fixed maximum of $(t_{DELAY}+t_{NAND})$ simply by reducing the frequency of the clock signal CLK. Thus where pulse widths of the ACLK signal are not sufficient to produce correct results within the semiconductor device 800 at relatively high frequencies of the clock signal CLK, it may be possible to make the semiconductor device 800 operational simply by reducing the frequency of the clock signal CLK. Further, the wider pulse widths achieved by reducing the frequency of the clock signal CLK may be beneficial during debugging and/or logic verification of the semiconductor device 800.

At higher frequencies of the clock signal CLK where the high time $t_{HIGH}$ of the clock signal CLK is less than $(t_{DELAY}+t_{NAND})$, the widths of positive pulses of the ACLK signal are equal to the high time $t_{HIGH}$ of the clock signal CLK. At lower frequencies of the clock signal CLK where the high time $t_{HIGH}$ is greater than or equal to ($t_{DELAY}$+ $t_{NAND}$), the widths of positive pulses are equal to ($t_{DELAY}$+ $t_{NAND}$). In the embodiment of FIG. 9, the time period ($t_{DELAY}$+$t_{NAND}$) is selected to be shorter than (e.g., just shorter than) an amount of time sufficient to counteract the effects of leakage currents from node N of the self-resetting logic circuit 802 at the lower frequencies. As a result, the self-resetting logic circuit 802 does not require a performance degrading keeper device (e.g., a PMOS transistor coupled between the high power supply voltage level $V_{DD}$ and the node N and receiving the output signal OUT at a gate terminal) to ensure proper operation of the self-resetting logic circuit 802 at the lower frequencies.

It is also noted that a fixed time delay of $t_{AND}$ exists between leading edges of the clock signal CLK and leading edges of the positive pulses of the ACLK signal at all frequencies of the clock signal CLK. As a result, synchronization may be more easily maintained between the self-resetting logic circuit 802 and other logic circuitry controlled by the clock signal CLK.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A pulse generator circuit, comprising:
   a delay element coupled to receive a clock signal CLK and a signal X and configured to produce a signal XN dependent upon the clock signal CLK and the signal X; and
   a logic circuit coupled to receive the clock signal CLK and the signal XN and configured to produce a signal ACLK such that ACLK=CLK·XN', wherein the signal ACLK comprises a series of positive pulses and XN', is the complement of the signal XN;
   wherein each of the positive pulses has a width substantially equal to a fixed maximum at relatively low frequencies of the clock signal CLK and substantially equal to a fixed minimum at relatively high frequencies of the clock signal CLK.

2. The pulse generator as recited in claim 1, wherein the clock signal CLK alternates between a high voltage level and a low voltage level.

3. The pulse generator as recited in claim 1, wherein the fixed minimum is an amount of time the clock signal CLK is the high voltage level.

4. The pulse generator as recited in claim 1, wherein the clock signal CLK comprises rising edges at transitions between the low voltage level and the high voltage level, and wherein each of the positive pulses of the signal ACLK is substantially delayed a fixed amount of time relative to a preceding rising edge of the clock signal CLK independent of the frequency of the clock signal CLK.

5. The pulse generator as recited in claim 2, wherein the delay element produces the signal XN at a node, and wherein the node is substantially charged to the high voltage level when both the signal X and the clock signal CLK are at the high voltage level, and wherein the node is substantially discharged to the low voltage level when either the signal X or the clock signal CLK transitions to the low voltage level.

6. The pulse generator as recited in claim 5, wherein the delay element comprises a 2-input AND gate coupled to receive the clock signal CLK at a first input and the signal X at the second input and having an output coupled to the node.

7. The pulse generator as recited in claim 5, wherein the delay element comprises an additional capacitance coupled between the node and a circuit ground.

8. The pulse generator as recited in claim 1, wherein the logic circuit comprises:
   a 2-input NAND gate coupled to receive the clock signal CLK at a first input and the signal XN at the second input and producing a signal B such that B=(CLK·XN)'; and
   a 2-input AND gate coupled to receive the clock signal CLK at a first input and the signal B at the second input and producing the signal ACLK such that ACLK=CLK·XN'.

9. The pulse generator as recited in claim 1, wherein the delay element is one of a plurality of delay elements coupled in series, and wherein the signal X is an output of a preceding one of the delay elements.

10. A pulse generator circuit, comprising:
    a series connected plurality of delay elements each comprising two input terminals and an output terminal, wherein one of the input terminals of each of the delay elements is coupled to receive a clock signal CLK, and wherein the other input terminal of a last of the delay elements is coupled to the output terminal of a preceding one of the delay elements, and configured to produce a signal XN at the output terminal dependent upon the clock signal CLK and an output signal produced by the preceding one of the delay elements; and
    a logic circuit coupled to receive the clock signal CLK and the signal XN and configured to produce a signal ACLK such that ACLK=CLK·XN', wherein the signal ACLK comprises positive pulses and XN'is the complement of the signal XN;
    wherein each of the positive pulses has a width substantially equal to a fixed maximum at relatively low frequencies of the clock signal CLK and substantially equal to a fixed minimum at relatively high frequencies of the clock signal CLK.

11. The pulse generator as recited in claim 10, wherein the other input terminal of a first of the delay elements is coupled to receive the clock signal CLK.

12. The pulse generator as recited in claim 10, wherein the clock signal CLK alternates between a high voltage level and a low voltage level.

13. The pulse generator as recited in claim 12, wherein the clock signal CLK comprises rising edges at transitions between the low voltage level and the high voltage level, and wherein each of the positive pulses of the signal ACLK is substantially delayed a fixed amount of time relative to a preceding rising edge of the clock signal CLK independent of the frequency of the clock signal CLK.

14. A semiconductor device, comprising:
    a pulse generator circuit, comprising:
      a delay element coupled to receive a clock signal CLK and a signal X and configured to produce a signal XN dependent upon the clock signal CLK and the signal X;
      a logic circuit coupled to receive the clock signal CLK and the signal XN and configured to produce a signal ACLK such that ACLK=CLK·XN', wherein the signal ACLK comprises a series of positive pulses; and
a self-resetting logic circuit coupled to receive the signal ACLK and at least one input signal, and configured to perform a logic operation using the at least one input signal during the positive pulses.

15. The semiconductor device as recited in claim 14, wherein a node of the self-resetting logic circuit is precharged between the positive pulses of the signal ACLK, and the node is selectively discharged during the positive pulses dependent upon the at least one input signal.

16. The semiconductor device as recited in claim 14, wherein the semiconductor device comprises a random access memory (RAM) device, and the self-resetting logic circuit forms a part of a decoder circuit of the RAM device.

\* \* \* \* \*